(12) United States Patent
Shi et al.

(10) Patent No.: US 11,881,821 B2
(45) Date of Patent: Jan. 23, 2024

(54) SIGNAL GENERATING CIRCUIT AND AUDIO PROCESSING DEVICE

(71) Applicant: SPREADTRUM COMMUNICATIONS (SHENZHEN) CO., LTD., Shenzhen (CN)

(72) Inventors: Junliang Shi, Shenzhen (CN); Jianping Cheng, Shenzhen (CN); Mengzhang Li, Shenzhen (CN); Wenxian Lu, Shenzhen (CN)

(73) Assignee: SPREADTRUM COMMUNICATIONS (SHENZHEN) CO., LTD., Shenzen (CN)

( * ) Notice: Subject to any disclaimer, the term of this patent is extended or adjusted under 35 U.S.C. 154(b) by 433 days.

(21) Appl. No.: 17/419,233

(22) PCT Filed: Apr. 28, 2019

(86) PCT No.: PCT/CN2019/084767
§ 371 (c)(1),
(2) Date: Mar. 3, 2022

(87) PCT Pub. No.: WO2020/133850
PCT Pub. Date: Jul. 2, 2020

(65) Prior Publication Data
US 2022/0200549 A1    Jun. 23, 2022

(30) Foreign Application Priority Data
Dec. 29, 2018  (CN) .......................... 201811641771.3

(51) Int. Cl.
*H03F 3/21* (2006.01)
*H03K 5/24* (2006.01)
*H04R 3/00* (2006.01)

(52) U.S. Cl.
CPC ................. *H03F 3/21* (2013.01); *H03K 5/24* (2013.01); *H04R 3/00* (2013.01); *H03F 2200/03* (2013.01); *H04R 2420/01* (2013.01)

(58) Field of Classification Search
CPC .... H03F 2200/03; H03F 3/181; H03F 1/3264; H03F 3/21; H04R 1/1041; H04R 2225/61; H04R 2420/01; H04R 3/00
(Continued)

(56) References Cited

U.S. PATENT DOCUMENTS 6,819,912 B2 * 11/2004 Roeckner ............... H04B 15/04
330/10
7,062,050 B1 * 6/2006 Pompei .................... H04R 3/00
381/77

(Continued)

FOREIGN PATENT DOCUMENTS

CN  101103528 A   1/2008
CN  101030769 B   11/2010
(Continued)

OTHER PUBLICATIONS

The State Intellectual Property Office of the People's Republic of China, Second Office Action for Application No. CN201811641771.3.

(Continued)

*Primary Examiner* — Disler Paul
(74) *Attorney, Agent, or Firm* — Womble Bond Dickinson (US) LLP

(57) ABSTRACT

This disclosure relates to a signal generating circuit and an audio processing device. The circuit includes a switch module, a voltage producing module, and a signal generating module; the switch module is connected to the voltage producing module, including at least one control switch, and is used for receiving a frequency division signal. Based on (Continued)

the frequency division signal, the at least one control switch is turned on or turned off; the voltage producing module is separately connected to the switch module and the signal generating module and used for producing a first voltage and a second voltage. The at least one control switch controls the first voltage and the second voltage to change. The signal generating module is connected to the voltage producing module and used for generating a carrier signal with the same frequency as the frequency division signal according to the received first and second voltages.

10 Claims, 3 Drawing Sheets

(58) Field of Classification Search
USPC .............................................. 381/22–23, 120
See application file for complete search history.

(56) References Cited

U.S. PATENT DOCUMENTS

| | | | | |
|---|---|---|---|---|
| 7,333,541 | B2 * | 2/2008 | Min | G02F 1/29 |
| | | | | 375/238 |
| 7,808,324 | B1 * | 10/2010 | Woodford | H03F 3/21 |
| | | | | 330/296 |
| 8,526,640 | B2 * | 9/2013 | Han | H03K 17/164 |
| | | | | 330/10 |
| 9,654,069 | B2 * | 5/2017 | Buono | H03F 3/2173 |
| 10,224,821 | B2 * | 3/2019 | Zhang | H02M 1/08 |
| 2009/0214056 | A1 * | 8/2009 | Takahata | H04R 5/04 |
| | | | | 381/94.5 |
| 2016/0079917 | A1 | 3/2016 | Holzmann | |

FOREIGN PATENT DOCUMENTS

| | | |
|---|---|---|
| CN | 202563884 U | 11/2012 |
| CN | 103066954 A | 4/2013 |
| CN | 103078611 A | 5/2013 |
| CN | 104639121 A | 5/2015 |
| CN | 104868880 A | 8/2015 |
| CN | 105472507 A | 4/2016 |
| JP | 2004072657 A | 3/2004 |

OTHER PUBLICATIONS

The State Intellectual Property Office of the People's Republic of China, First Office Action for Application No. CN201811641771.3.
International Searching Authority, International Search Report dated Sep. 11, 2019, for Application No. PCT/CN2019/084767.

* cited by examiner

SIGNAL GENERATING CIRCUIT AND AUDIO PROCESSING DEVICE

CROSS-REFERENCE TO RELATED APPLICATION

This application is a National Stage of International Application No. PCT/CN2019/084767 filed on Apr. 28, 2019, which claims priority to the Chinese Application No. 201811641771.3, filed on Dec. 29, 2018, both of which are incorporated herein by reference in their entirety.

TECHNICAL FIELD

The present disclosure relates to the field of integrated circuits, and in particular to a signal generation circuit and an audio processing device.

BACKGROUND

An audio codec system can encode or decode received audios and be commonly applied in a range of application fields, for example, in wireless communications and audio systems. The audio codec system may include an analog-to-digital converter, a digital-to-analog converter, and an audio amplifier. The analog-to-digital converter can convert an analog electrical signal of an external sound into a digital audio signal adapted for a digital process. The digital-to-analog converter can convert a digital audio signal to an analog audio signal. The audio amplifier can amplify the analog audio signal converted by the digital-to-analog converter and drive various electronic sound generating loads to convert the amplified analog audio signal into sound.

Due to the existence of various frequency signals in the audio codec system, the audio codec system is prone to out-of-band noises or signal aliasing. Usually, an anti-aliasing filter with high filtering steepness may be used before the analog-to-digital converter line to eliminate signal aliasing. However, this approach requires the use of an anti-aliasing filter with a larger area, which increases the design difficulty and cost of the audio codec system.

SUMMARY

In view of this, the present disclosure proposes a signal generation circuit and an audio processing device capable of reducing the design difficulty and the cost for an anti-aliasing interference circuit.

According to an aspect of the present disclosure, provided is a signal generation circuit, comprising: a switch module, a voltage generation module and a signal generation module, the switch module connected with the voltage generation module, comprising at least one control switch, configured to receive a frequency-divided signal and to cause, under an action of the frequency-divided signal, the at least one control switch to open or close; the voltage generation module connected with the switch module and the signal generation module respectively, configured to generate a first voltage and a second voltage, wherein the at least one control switch controls the first voltage and the second voltage to change; the signal generation module connected with the voltage generation module and configured to generate, in accordance with the first voltage and the second voltage which are received, a carrier signal having a frequency consistent with a frequency of the frequency-divided signal.

In a possible implementation, the circuit further comprises: a frequency-division module connected with the switch module, configured to receive a clock signal, to perform frequency division on the clock signal, and to output to the switch module a frequency-divided signal with a predetermined frequency, wherein the predetermined frequency is determined based on a frequency of the clock signal and a frequency of an original carrier signal of a power amplifier circuit, the power amplifier circuit being configured to perform amplification of an analog audio signal based on the carrier signal.

In a possible implementation, the voltage generation module comprises at least one short-circuit resistor, the short circuit resistor being connected in parallel with the control switch; the short circuit resistor is configured to be in a short circuit state based on the control switch being in a closed state, such that the first voltage has a first voltage value and the second voltage has a third voltage value; to be in a connected state based on the control switch being in an open state, such that the first voltage has a second voltage value and the second voltage has a fourth voltage value; wherein the first voltage value is smaller than the second voltage value, the third voltage value is smaller than the fourth voltage value.

In a possible implementation, the voltage generation module further comprises a voltage-divider resistor, the voltage-divider resistor being connected in series with the short-circuit resistor, configured to generate the first voltage at a first end and to generate the second voltage at a second end.

In a possible implementation, the switch module comprises a first control switch and a second control switch; the short circuit resistor comprises a first short circuit resistor and a second short circuit resistor; the first short circuit resistor connected in parallel with the first control switch and connected in series with the voltage-divider resistor, located between the voltage-divider resistor and a power source; the second short circuit resistor connected in parallel with the second control switch and connected in series with the voltage-divider resistor, located between the voltage-divider resistor and a ground.

In a possible implementation, the signal generation module comprises a capacitor, a first branch circuit, a second branch circuit and a comparison unit; the comparison unit connected with the voltage generation module and the capacitor respectively, configured to receive the first voltage and the second voltage and to output to the first branch circuit a first feedback signal at first level based on a voltage of the capacitor being smaller than the second voltage, and to output to the second branch circuit a first feedback signal at first level based on a voltage of the capacitor being larger than a voltage of the first feedback signal; the first branch circuit connected with the capacitor, configured to charge the capacitor under an action of the first feedback signal at first level; the second branch circuit connected with the capacitor, configured to cause the capacitor to discharge under an action of the second feedback signal at first level; the capacitor connected with the first branch circuit and the second branch circuit respectively, configured to generate the carrier signal at a connecting end connected with the first branch circuit and the second branch circuit.

In a possible implementation, the comparison unit comprises a first comparator, a second comparator and a trigger; the first comparator having a first input end configured to receive the first voltage, a second input end configured to receive a carrier signal generated by the capacitor, and a first output end configured to output to the trigger a first comparison signal and to cause the trigger to output to the first branch circuit a first feedback signal at second level based on a voltage of the carrier signal being larger than the first voltage; the trigger including a first trigger end and a first feedback end, configured to receive the first comparison signal at the first trigger end and to output to the first branch circuit a first feedback signal at the first feedback end; the first branch circuit including a first current source and a first branch circuit switch; the first current source connected in series with the first branch circuit switch, with a current direction being a direction towards the capacitor; the first branch circuit switch connected with the capacitor, configured to disconnect the capacitor in accordance with the first feedback signal at second level, such that the capacitor discharges through the second branch circuit.

In a possible implementation, the comparison unit further comprises: a second comparator including a third input end configured to receive a carrier signal output by the capacitor, a fourth input end configured to receive the second voltage, a second output end configured to output to the trigger a second comparison signal and to cause the trigger to output to the second branch circuit a second feedback signal at second level based on a voltage of the carrier signal being smaller than the second voltage; the trigger further comprises a second trigger end and a second feedback end, configured to receive the second comparison signal at the second trigger end and to output to the second branch circuit a second feedback signal at the second feedback end; the second branch circuit including a second current source and a second branch circuit switch, the second current source connected in series with the second branch circuit switch, with a current direction being a direction towards the ground; the second branch circuit switch connected in series with the capacitor, configured to disconnect the capacitor according to the second feedback signal at second level, such that the capacitor is charged through the first branch circuit.

According to another aspect of the present disclosure, provided is an audio processing device, comprising: a digital-to-analog converter, a power amplifier circuit and the signal generation circuit described above, the digital-to-analog converter connected with the power amplifier circuit, configured to receive a digital audio signal, to convert the digital audio signal received into an analog audio signal, and to input the analog audio signal into the power amplifier circuit; the signal generation circuit connected with the power amplifier circuit, configured to generate a carrier signal with a predetermined frequency and to output the carrier signal generated to the power amplifier circuit; the power amplifier circuit connected with the digital-to-analog converter and the signal generation module respectively, configured to receive the analog audio signal, to amplify the analog audio signal under an action of the carrier signal and to output an amplified signal, wherein a frequency of the amplified signal is identical to a frequency of the carrier signal, a clock frequency of the digital-to-analog converter is an integral multiple of the frequency of the carrier signal.

In a possible implementation, the device further comprises: an analog-to-digital converter connected with the digital-to-analog converter, configured to receive an audio signal, to convert the audio signal into a digital audio signal and to output the digital audio signal to the digital-to-analog converter; the analog-to-digital converter having a clock signal that is an integral multiple of the frequency of the carrier signal.

Using the signal generation circuit and the audio processing device proposed by the present disclosure, it is possible to cause at least one control switch to open or close based on a frequency-divided signal, thereby controlling the first voltage and the second voltage to change. According to the changed first voltage and second voltage, a carrier signal is generated, with a frequency that is identical to the frequency of the frequency-divided signal. Because the generated carrier signal and the frequency-divided signal have the same frequency, the frequency-divided signal and the clock signal of the circuit are synchronous signals. As a result, when an analog audio signal is transmitted and output using a carrier signal, the output analog audio signal can have a frequency consistent with the frequency of the frequency-divided signal, thereby reducing aliasing interference between signals. Furthermore, the method provided by the present disclosure to reduce aliasing interference may be implemented by introducing a frequency-divided signal and a switch module into an audio processing device, which only requires simple operation while saving the size and the cost for the chip.

Additional features and aspects of the present disclosure will become apparent from the following description of exemplary examples with reference to the attached drawings.

BRIEF DESCRIPTION OF THE DRAWINGS

The drawings, which are incorporated in and constitute part of the specification, together with the description, illustrate exemplary examples, features and aspects of the present disclosure and serve to explain the principles of the present disclosure.

DETAILED DESCRIPTION

Figure 1:
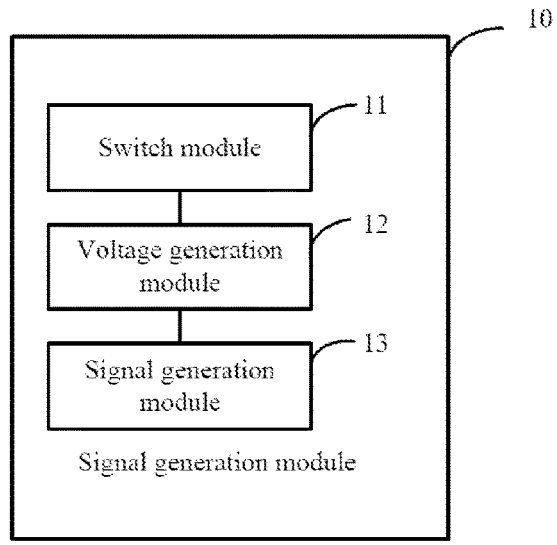
FIG. 1 illustrates a block diagram of a signal generation circuit according to an embodiment of the present disclosure.

Various exemplary examples, features and aspects of the present disclosure will be described in detail with reference to the drawings. The same reference numerals in the drawings represent parts having the same or similar functions. Although various aspects of the examples are shown in the drawings, it is unnecessary to proportionally draw the drawings unless otherwise specified.

Herein the term "exemplary" means "used as an instance or example, or explanatory". An "exemplary" example given here is not necessarily construed as being superior to or better than other examples.

Numerous details are given in the following examples for the purpose of better explaining the present disclosure. It should be understood by a person skilled in the art that the present disclosure can still be realized even without some of those details. In some of the examples, methods, means, units and circuits that are well known to a person skilled in the art are not described in detail so that the principle of the present disclosure become apparent.

The signal generation circuit provided by the present disclosure can be applicable to an audio processing device. In some instances, the audio processing device may include an Analog to Digital Converter (ADC), a Digital to Analog Converter (DAC) and a power amplifier circuit. The signal generation circuit provided by the present disclosure can provide a carrier signal for the power amplifier circuit. Since the carrier signal and the clock signal are synchronous signals, the analog audio signal output by the power amplifier based on the carrier signal and the clock signal are synchronous signals. As such, it is possible to reduce aliasing interference between signals in the audio processing device. Herein, the clock signal may be clock signals of the ADC and the DAC.

The analog audio signal output by the power amplifier circuit may cause interference with the ADC via the power source or the ground line. Since the analog audio signal output by the power amplifier circuit and the clock signal of the ADC are not synchronous signals, and the frequency of the analog audio signal output by the power amplifier circuit is not an integral multiple of the clock signal of the ADC, the analog audio signal output by the power amplifier circuit may produce aliasing interference with the signals in the ADC, which affects the performance of the ADC. Meanwhile, the input signal of the power amplifier circuit results from the output of the DAC. The analog audio signal output by the DAC is an audio out-of-band noise signal at a relatively high clock frequency, which is not a synchronous signal of the carrier signal of the power amplifier circuit; and the frequency of the analog audio signal output by the DAC is not an integral multiple of the carrier signal of the power amplifier circuit. Thus, when the analog audio signal output by the DAC is input into the power amplifier circuit, signal aliasing may occur, generating an audio in-band signal at a different frequency in the power amplifier circuit which interferes with the original analog audio signal output by the DAC. Here, synchronous signals may be interpreted as signals with the same time reference.

The signal generation circuit and the audio processing device provided by the present disclosure are described below with reference to specific embodiments.

FIG. 1 illustrates a block diagram of a structure of a signal generation circuit 10 according to an embodiment of the present disclosure. As shown in FIG. 1, the signal generation circuit 10 includes: a switch module 11, a voltage generation module 12, and a signal generation module 13.

The switch module 11 is connected with the voltage generation module 12, includes at least one control switch, and is configured to receive a frequency-divided signal to cause, under an action of the frequency-divided signal, the at least one control switch to open or close based on the frequency-divided signal.

The voltage generation module 12 is respectively connected with the switch module 11 and the signal generation module 13, and configured to generate a first voltage and a second voltage, where the at least one control switch controls the first voltage and the second voltage to change.

The signal generation module 13 is connected with the voltage generation module 12, and configured to generate, based on the first voltage and the second voltage which are received, a carrier signal having the same frequency as the frequency-divided signal.

Herein, the frequency-divided signal received by the switch module 11 may be a pulse signal, i.e., of which the signal strength is variable over time, such as a square wave signal. The frequency-divided signal may be obtained by carrying out a frequency division on the clock signals of both the DAC and the ADC of the audio processing device. For example, a divide-by-even frequency (such as a divide-by-6 frequency, a divide-by-8 frequency) operation is performed on the clock signals of both the DAC and the ADC, to obtain the frequency-divided signal. The frequency-divided signal may also be obtained directly from the clock signals of both the DAC and the ADC of the audio processing device, i.e., without a frequency division operation. The frequency-divided signal and the clock signal are synchronous signals, i.e., originates from signal pulses of the same frequency. The frequency of the frequency-divided signal is an integral multiple of the frequency of the clock signal.

In a possible implementation, the switch module 11 may include a plurality of control switches. After receiving the frequency-divided signal, the control switches in the switch module 11 may be opened or closed based on the frequency-divided signal. For example, based on the frequency-divided signal being at a first level, the control switches may be closed; based on the frequency-divided signal being at a second level, the control switches may be opened. It should be noted that the first level and the second level may be logic levels. The first level may be a logic high level higher than the absolute level while the second level may be a logic low level lower than the absolute level. For example, the absolute level may be set to a value such as 3.5V, 1.5V, and so on, so that the first level may be a level higher than 3.5V and the second level may be a level lower than 1.5V.

The switch module 11 may be connected with the voltage generation module 12. The voltage generation module 12 can generate the first voltage and the second voltage. The first voltage and the second voltage may have different voltage values, where the first voltage may be larger than the second voltage. The first voltage and the second voltage may be generated by a resistor structure or a power source structure. For example, the first voltage or the second voltage may be generated by a voltage division operation among a plurality of resistors. The first voltage and the second voltage may have different voltage values under the control of the control switch. For example, based on the control switch being closed, the first voltage has a first voltage value while the second voltage has a third voltage value; based on the control switch being opened, the first power source has a second voltage value while the second voltage has a fourth voltage value. The first voltage value is different from the second voltage value; and the third voltage value is different from the fourth voltage value. Here, the frequency of change in the voltage values of the first voltage and the second voltage may be the same as the frequency of the frequency-divided signal.

In a possible implementation, the voltage generation module 12 may generate the first voltage and the second voltage in a manner of dividing a voltage via resistors connected in series with each other. For example, the voltage generation module 12 may include at least one short-circuit resistor. The short circuit resistor may be connected in parallel with the control switch of the switch module 11. The number of the short-circuit resistors may be the same as that of the control switches. Since the short-circuit resistor is connected in parallel with the control switch, the short-circuit resistor may be in a short-circuit state based on the control switch being in the closed state so that the first voltage has the first voltage value and the second voltage has the third voltage value; the short-circuit resistor may be in an on-state based on the control switch being in the open state so that the first power source has the second voltage value and the second voltage has the fourth voltage value. As such, the short circuit resistor can change the first voltage and the second voltage generated by the signal generation module based on the control switch.

Here, the voltage generation module 12 may further include a voltage-divider resistor. The voltage-divider resistor may be connected in series with the short-circuit resistor and may be located between the short-circuit resistor and the power source or between the short-circuit resistor and the ground. The voltage-divider resistor may include a first terminal and a second terminal. The first terminal of the voltage-divider resistor may generate the first voltage and the second terminal of the voltage-divider resistor may generate the second voltage. The voltage-divider resistor may further include a third terminal and a fourth terminal. The third terminal of the voltage-divider resistor may be connected with the short-circuit resistor or the power source and the fourth terminal of the voltage-divider resistor may be connected with the short-circuit resistor or the ground.

The signal generation module 13 described above may be connected with the voltage generation module 12. The signal generation module 13 may receive both the first voltage and the second voltage generated by the voltage generation module 12 and may generate a carrier signal having the same frequency as the frequency-divided signal based on the first voltage and the second voltage. The carrier signal may have a waveform of a triangular wave, a square wave, and the like. The carrier signal generated by the signal generation module 13 may be input into the power amplifier circuit as the carrier signal of the power amplifier circuit, to amplify the analog audio signal output by the DAC; the amplified signal has a frequency consistent with the frequency of the frequency-divided signal and is an integral multiple of the frequency of the clock signal of the DAC or the ADC, thereby reducing aliasing interference between signals in the audio processing device.

In a possible implementation, the signal generation circuit 10 may further include a frequency-division module (not shown). The frequency-division module may be connected with the switch module 11 and configured to receive the clock signal, to perform frequency division on the clock signal, and to output to the switch module 11 a frequency-divided signal having a preset frequency. Here, the preset frequency may be determined based on a frequency of the clock signal and a frequency of the original carrier signal of the power amplifier circuit. The clock signal may be the clock signals of both the DAC and the ADC of the audio processing device, or may be a clock signal synchronous with both the DAC and the ADC. The frequency of the original carrier signal of the power amplifier circuit may be understood as the frequency of the carrier signal of the power amplifier circuit before the signal generation circuit according to the present disclosure is added to the audio processing device. The original carrier signal of the power amplifier circuit and the clock signal of the DAC and the ADC are asynchronous signals. Furthermore, the frequency of the original carrier signal of the power amplifier circuit is not an integral multiple of the frequency of the clock signals of the DAC and the ADC. Therefore, the preset frequency of the frequency-divided signal may be determined based on the frequency of the clock signal and the frequency of the original carrier signal of the power amplifier circuit. For example, the predetermined frequency of the frequency-divided signal may be set to an integral multiple of the frequency of the clock signal between the clock frequency and the original carrier signal frequency of the power amplifier circuit. As such, the frequency of the frequency-divided signal may be set to be close to the frequency of the original carrier signal of the power amplifier circuit.

In the foregoing description of the signal generation circuit, the connection between the modules of the modules of the signal generation circuit and their respective functions are described. Further description of the signal generation circuit according to the present disclosure is provided below with reference to FIG. 2.

Figure 2:
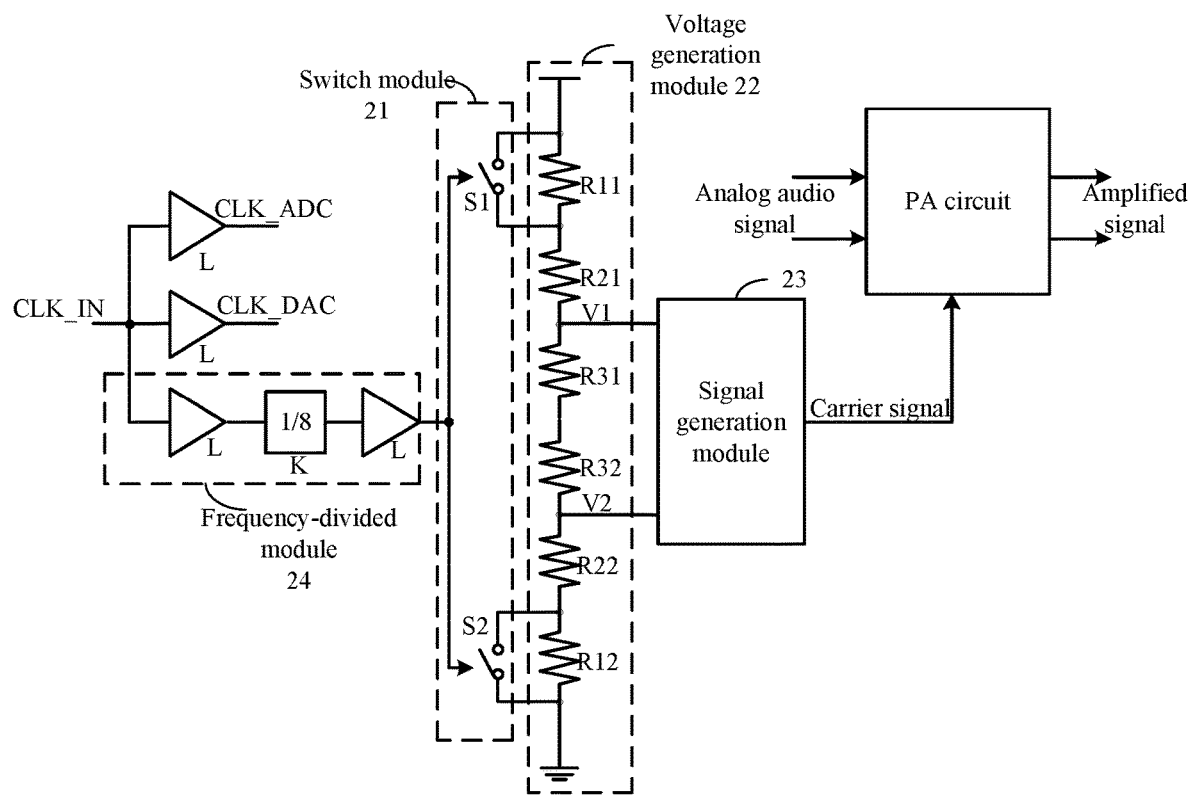
FIG. 2 illustrates a schematic diagram of the signal generation circuit according to an embodiment of the present disclosure.

FIG. 2 illustrates a schematic diagram of the signal generation circuit 20 according to an embodiment of the present disclosure. The signal generation circuit 20 may include: a switch module 21, a voltage generation module 22, a signal generation module 23 and a frequency-division module 24.

The frequency-division module 24 may include a frequency divider K. The frequency-division module 24 may receive a clock signal CLK_IN synchronous with the ADC and the DAC. The frequency divider K may convert the clock signal CLK_IN to a frequency-divided signal having a preset frequency, where the clock signal of the ADC may be represented by CLK_ADC, the clock signal of the DAC may be represented by CLK_DAC. The frequency-division module 24 may further include a buffer L. The clock signal CLK_IN may be divided by the frequency divider K after passing through the buffer L. Similarly, the clock signal CLK_IN may pass through the buffer L to obtain the clock signal CLK_ADC of the ADC or the clock signal CLK_DAC of the DAC.

The switch module 21 may include a first control switch S1 and a second control switch S2. The first control switch S1 and the second control switch S2 may be opened or closed by means of the frequency-divided signal. The voltage generation module 22 may include a first short-circuit resistor R11, a second short-circuit resistor R12, a voltage-divider resistor R21, a voltage-divider resistor R22, a voltage-divider resistor R31, and a voltage-divider resistor R32, which are connected in series with each other. The first short-circuit resistor R11 may be connected in parallel with the first control switch S1; the second-short circuit resistor R12 may be connected in parallel with the first control switch S2; the first short-circuit resistor R11 has one terminal connected with the power source and the other terminal of the first short-circuit resistor R11 connected with the voltage-divider resistor R21. The voltage-divider resistor R21 has one terminal connected with the first short-circuit resistor R11 and the other terminal of the voltage-divider resistor R21 connected with the voltage-divider resistor R31. The voltage-divider resistor R31 has one terminal connected with the voltage-divider resistor R21 and the other terminal of the voltage-divider resistor R31 connected with the voltage-divider resistor R32. The terminal of the voltage-divider resistor R31 connected with the voltage-divider resistor R21 may have the first voltage V1. The voltage-divider resistor R32 has one terminal connected with the voltage-divider resistor R22 and the other terminal of the voltage-divider resistor R32 connected with the voltage-divider resistor R31. The terminal of the voltage-divider resistor R31 connected with the voltage-divider resistor R22 may have the second voltage V2. The voltage-divider resistor R22 has one terminal connected with the second-short circuit resistor R12 and the other terminal of the voltage-divider resistor R22 connected with the voltage-divider resistor R32. The second short-circuit resistor R12 has one terminal connected with the ground and the other terminal of the second short-circuit resistor R12 connected with the voltage-divider resistor R22. In a possible implementation, the first short-circuit resistor R11 and the voltage-divider resistor R21 may swap positions; and the second short-circuit resistor R12 and the voltage-divider resistor R22 may swap positions. There may be one or more of the voltage-divider resistors. In order to facilitate determining the voltage value of the carrier signal, two voltage-divider resistors may be provided. The first short-circuit resistor R11 may have the same resistance as the second short-circuit resistor R12; the voltage-divider resistor R21 may have the same resistance as the voltage-divider resistor R22; and the voltage-divider resistor R31 may have the same resistance as the voltage-divider resistor R32.

As the first control switch S1 and the second control switch S2 may be opened or closed by means of the frequency-divided signal, the first short-circuit resistor R11 connected in parallel with the first control switch S1 and the second short-circuit resistor R12 connected in parallel with the second control switch S2 may be in a short-circuit state or in a connected state at a preset frequency based on the first control switch S1 and the second control switch S2, such that the first voltage V1 changes between the first voltage value VREFH−A and the second voltage value VREFH+A and the second voltage V2 changes between the third voltage value VREFL−A and the fourth voltage value VREFL+A.

Figure 3:
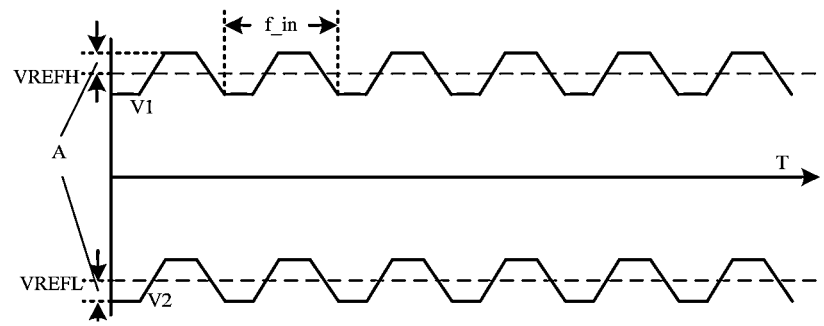
FIG. 3 illustrates a waveform diagram of the first voltage and the second voltage according to an embodiment of the present disclosure.

FIG. 3 illustrates a waveform diagram of the first voltage and the second voltage according to the embodiment of the present disclosure. The waveforms of the first voltage V1 and the second voltage V2 which change over time T are shown in FIG. 3. The change frequency fin of the first voltage V1 and that of the second voltage V2 are the same as the frequency of the frequency-divided signal, i.e., equal to the predetermined frequency. Here, A may be determined according to the ratio among R11, R21 and R31.

Figure 4:
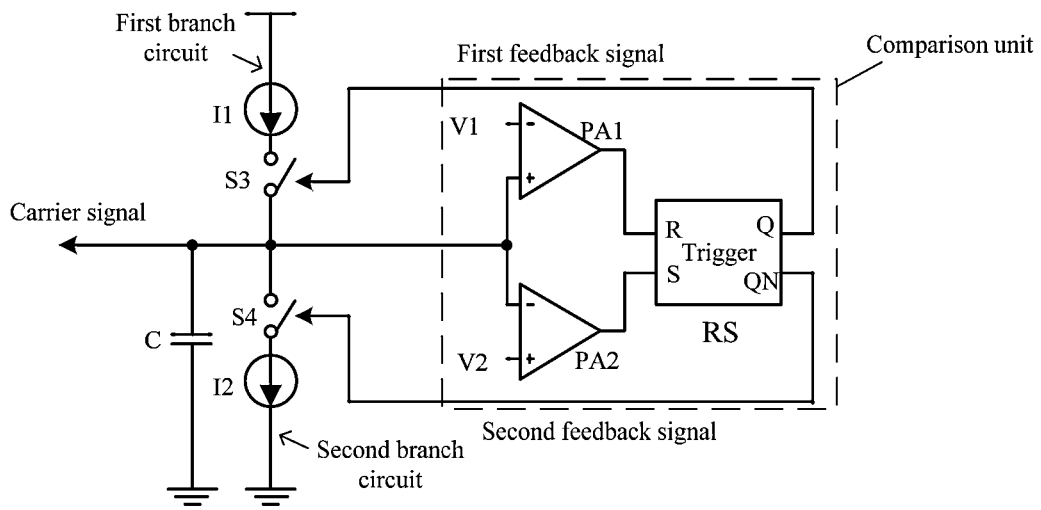
FIG. 4 illustrates a block diagram of the signal generation module according to an embodiment of the present disclosure.

FIG. 4 illustrates a block diagram of the signal generation module according to an embodiment of the present disclosure. The signal generation module 23 according to the embodiment of the present disclosure may include a capacitor C, a first branch circuit, a second branch circuit and a comparison unit. The comparison unit may be respectively connected with the voltage generation module 22 and the capacitor C. The comparison unit receives the first voltage V1 and the second voltage V2 to output to the first branch circuit a first feedback signal having a first level based on the voltage of the capacitor C being smaller than the second voltage V2. The comparison unit may further output to the second branch circuit a second feedback signal having the first level based on the voltage of the capacitor C being larger than the first voltage V1. The first branch circuit may be connected with the capacitor C to charge the capacitor C based on the first feedback signal having the first level. The second branch circuit may be connected with the capacitor C and causes the capacitor C to discharge based on the second feedback signal having the first level. The capacitor C may have one terminal respectively connected with the first branch circuit and the second branch circuit, and may output at the one terminal connected with the first branch circuit and the second branch circuit a carrier signal. The other terminal of the capacitor C may be connected with the ground.

In a possible implementation, the comparison unit may include a first comparator PA1, a second comparator PA2, and a trigger RS. The first comparator PA1 may include a first input terminal, a second input terminal, and a first output terminal. The first input terminal of the first comparator PA1 may be a positive input terminal configured to receive the first voltage V1. The second input terminal of the first comparator PA1 may be a negative input terminal configured to receive the carrier signal output by the capacitor. The first output terminal of the first comparator PA1 may be connected with the trigger RS to output to the trigger RS a first comparison signal. The frequency of the first comparison signal is consistent with the frequency of the frequency-divided signal. Likewise, the second comparator PA2 may include a third input terminal, a fourth input terminal, and a second output terminal. The third input terminal of the second comparator PA2 may be a positive input terminal configured to receive the carrier signal output by the capacitor C. The fourth input terminal of the second comparator PA2 may be a negative input terminal configured to receive the second voltage V2. The second output terminal of the second comparator PA2 may be connected with the trigger RS to output to the trigger RS a second comparison signal. The frequency of the second comparison signal is consistent with the frequency of the frequency-divided signal. The trigger RS may include a first trigger terminal R configured to receive a first comparison signal and a first feedback terminal Q configured to output to the first branch circuit a first feedback signal. The trigger RS further includes both a second trigger terminal S which may receive a second comparison signal and a second feedback terminal QN which may output to the second branch circuit a second feedback signal.

In a possible implementation, the first branch circuit may include both a first current source I1 and a first branch circuit switch S3. The first current source I1 has one terminal connected with the ground and the other terminal connected with the first branch circuit switch S3. The current direction of the first current source I1 is a direction flowing toward the capacitor. The first branch circuit switch S3 has a first terminal connected with the first current source I1, a second terminal connected with the capacitor C, and a third terminal that receives the first feedback signal output by the first comparator PA1. The first branch circuit switch S3 may be turned on or off based on the first feedback signal. For example, according to the first feedback signal having the second level, the first branch circuit switch S3 may disconnect from the capacitor C based on the voltage of the carrier signal being larger than the first voltage, so that the capacitor C discharges via the second branch circuit.

The second branch circuit may include a second current source I2 and a second branch circuit switch S4. The second current source I2 has one terminal connected with the ground and the other terminal connected with the second branch circuit switch S4. The current direction of the second current source I2 is a direction flowing toward the ground. The first current source I1 and the second current source I2 may have the same current values. The second branch circuit switch S4 has a first terminal connected with the capacitor C, a second terminal connected with the second current source I2, and a third terminal that receives a second feedback signal output by the second comparator PA2. The second branch circuit switch S4 may be turned on or off based on the second feedback signal. For example, according to the second feedback signal having the second level, the second branch circuit switch S4 may disconnect from the capacitor C based on the voltage of the carrier signal being smaller than second voltage, so that the capacitor C is charged via the first branch circuit.

The process of the signal generation module generating the carrier signal is explained below with reference to FIG. 4.

Based on the first comparator PA1 determining that the first voltage V1 is smaller than the voltage of the carrier signal, the trigger RS outputs to the first branch circuit switch S3 of the first branch circuit the first feedback signal having the first level. The first branch circuit switch S3 is turned off based on the first feedback signal having the first level. At that time, the second comparator PA2 determines that the second voltage V2 is smaller than the voltage of the carrier signal and outputs to the second branch circuit switch S4 of the second branch circuit the second feedback signal having the second level; the second branch circuit switch S4 is turned on based on the second feedback signal having the second level, so that the capacitor C discharges via the second branch circuit. Based on the second comparator PA2 determining that second voltage V2 is larger than the voltage of the carrier signal, the trigger RS outputs to the second branch circuit switch S4 of the second branch circuit the second feedback signal having the first level. The second branch circuit switch S4 is turned off based on the second feedback signal having the first level. At that time, the first comparator PA1 determines that the first voltage V1 is larger than the voltage of the carrier signal and outputs to the first branch circuit switch S3 of the first branch circuit the first feedback signal having the second level; the first branch circuit switch S3 is turned on based on the first feedback signal having the second level, so that the capacitor C is charged via the first branch circuit. The capacitor C charges and discharges continually via the first branch circuit and the second branch circuit, making it possible to generate a carrier signal at the terminal connected with both the first branch circuit and the second branch circuit.

Figure 5:
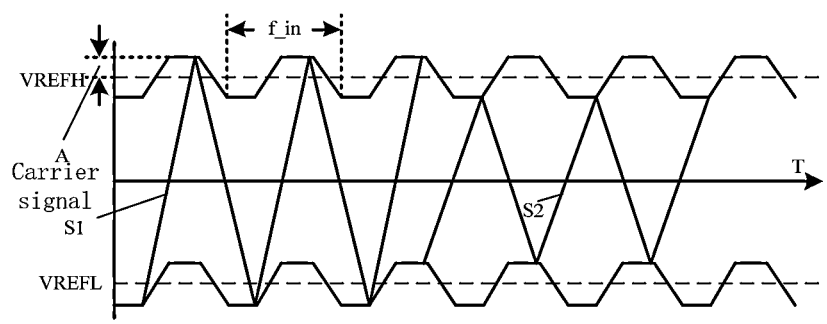
FIG. 5 illustrates a waveform diagram of the carrier signal according to an embodiment of the present disclosure.

FIG. 5 illustrates a waveform diagram of the carrier signal according to an embodiment of the present disclosure. The carrier signal generated by the signal generation module 23 may be a triangular waveform signal changing constantly between the first voltage V1 and the second voltage V2 over time T; and the waveform slope of the carrier signal is between S1 and S2. The signal generation module may, after generating the carrier signal, input the carrier signal into the power amplifier circuit. After the carrier signal is input into the power amplifier circuit, the analog audio signal received by the power amplifier circuit may be amplified based on the carrier signal. Based on the carrier signal being a triangular waveform signal, the amplified signal output by the power amplifier circuit may be changed constantly over time.

Figure 6:
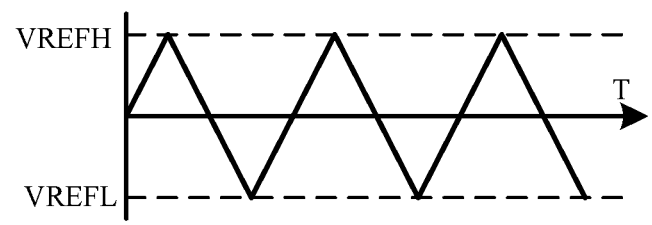
FIG. 6 illustrates a waveform diagram of the carrier signal according to an embodiment of the present disclosure.

FIG. 6 illustrates a waveform diagram of the carrier signal according to an embodiment of the present disclosure. If the first voltage V1 and the second voltage V2 are fixed voltages, for example, the first voltage V1 is VREFH and the second voltage V2 is VREFL, the waveform of the original carrier signal generated by the signal generation module 23 which changes over time T may be as illustrated by FIG. 6. The frequency of the original carrier signal is determined based on the capacitance C and the current value of the current source. After the signal generation module 23 accesses the first voltage V1 and the second voltage V2 that have changed, the frequency of the carrier signal may be fixed to the frequency of the frequency-divided signal.

It should be noted that the frequency of the original carrier signal needs to satisfy the following condition: after the first voltage V1 and the second voltage V2 that have changed provided in the present disclosure are accessed, the frequency of the carrier signal generated by the signal generation module may be fixed:

S/[2*(VREFH−VREFL)+2 A]<f_triangle<S/[2*(VREFH−VREFL)−2 A]

f_triangle>f_in*A/(VREFH−VREFL);

where S represents a waveform slope of the original carrier signal, f_triangle represents a frequency of the original carrier signal, VREFH represents a peak voltage of the original carrier signal, VREFL represents a valley voltage of the original carrier signal, A represents the voltage change value of the carrier signal after the first voltage V1 and the second voltage V2 that have changed are accessed, that is, after the signal generation module accesses the first voltage V1 and the second voltage V2 that have changed, the peak voltage of the carrier signal is VREFH+A and the valley voltage of the carrier signal is VREFH+A, f_in represents a frequency of the frequency-divided signal.

It should be noted that the first control switch S1, the second control switch S2, the third control switch S3 and the fourth control switch S4 provided by the embodiments of the present disclosure may be semiconductor transistors, such as bipolar transistors, field-effect transistors.

Figure 7:
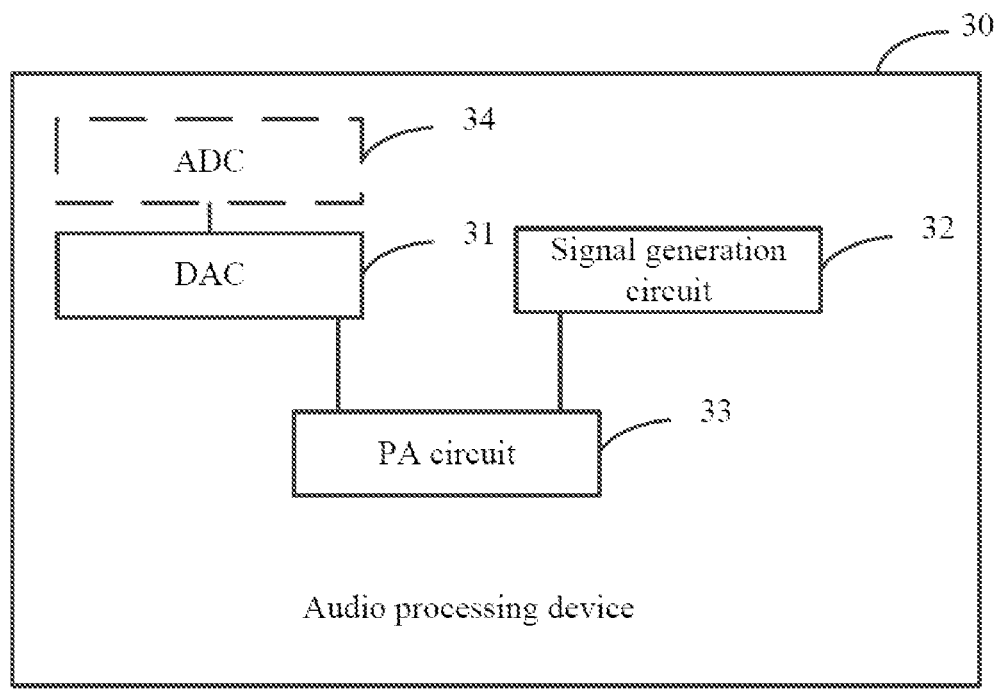
FIG. 7 illustrates a block diagram of an audio processing device according to an embodiment of the present disclosure.

FIG. 7 illustrates a block diagram of an audio processing device according to an embodiment of the present disclosure. Based on the signal generation circuit provided in the foregoing embodiments, as shown in FIG. 7, the embodiments of the present disclosure further provides an audio processing device 30, including: a digital-to-analog converter 31, a signal generation circuit 32 and a power amplifier circuit 33.

The digital-to-analog converter 31 is connected with the power amplifier circuit 33 and configured to receive a digital audio signal, to convert the received digital audio signal into an analog audio signal, and to input the analog audio signal into the power amplifier circuit 33.

The signal generation circuit 32 is connected with the power amplifier circuit 33 and may include the signal generation circuit provided in the foregoing embodiments configured to generate a carrier signal having a preset frequency and to input into the power amplifier circuit 33 the generated carrier signal.

The power amplifier circuit 33 is connected with the digital-to-analog converter 31 and the signal generation module 32, respectively, and is configured to receive the analog audio signal and amplify the analog audio signal based on the carrier signal to output the amplified signal, wherein the frequency of the amplified signal is consistent with the frequency of the carrier signal, and the clock frequency of the digital-to-analog converter is a multiple of the frequency of the carrier signal. The power amplifier circuit may be a Class D power amplifier circuit.

In a possible implementation, the digital-to-analog converter 31 may convert the digital audio signal into an analog audio signal and input into the power amplifier circuit 33 the converted analog audio signal. The power amplifier circuit 33 uses the carrier signal generated by the signal generation circuit 32 as the carrier wave of the analog audio signal to amplify the received analog audio signal and outputs an amplified signal with a frequency consistent with the frequency of the carrier signal. Since the carrier signal and the clock signal of the digital-to-analog converter 31 are synchronous signals, it is possible to reduce aliasing interference between the internal signals of the audio processing device 30. Furthermore, the signal generation circuit provided by the embodiments of the present disclosure is simple-structured, which saves the circuit design costs.

In some possible implementation, the audio processing device 30 may further include an analog-to-digital converter 34.

The analog-to-digital converter 34 may be connected with the digital-to-analog converter 31 and configured to receive an audio signal, to convert the audio signal into a digital audio signal, and to output to the digital-to-analog converter 31 the digital audio signal. The clock signal of the analog-to-digital converter 31 and the carrier signal generated by the signal generation circuit 32 are synchronous signals, which also reduces aliasing interference between the internal signals of the audio processing device 30.

The signal generation circuit and the audio processing device provided by the present disclosure can generate a carrier signal with a frequency consistent with the frequency of the clock signals of the DAC and the ADC. When the power amplifier circuit uses the carrier signal to amplify the analog audio signal, the frequency of the output amplified signal is an integral multiple of the frequency of the clock signal of the DAC and the ADC. As such, it is possible to synchronize the frequency of the amplified signal, i.e., fix the frequency of the amplified signal to a signal frequency synchronous with the clock signals of the ADC and the DAC, thereby reducing frequency interference caused by the amplified signal of the power amplifier circuit interfering with the ADC circuit by way of the power source or the ground line. Moreover, since the carrier signal and the clock signal of the DAC are synchronous, it is possible to reduce the interference with the analog audio signal by the power amplifier circuit in amplifying the analog audio signal output to the DAC, thereby reducing the risk of aliasing interference occurring in the audio processing device and improving the audio signal processing quality of the audio processing device. Furthermore, the signal generation circuit provided by the embodiments of the present disclosure is simple-structured, which saves the costs for circuit design and use of the audio processing device.

Although the embodiments of the present disclosure have been described above, it will be appreciated that the above descriptions are merely exemplary, but not exhaustive; and that the disclosed embodiments are not limiting. A number of variations and modifications may occur to one skilled in the art without departing from the scopes and spirits of the described embodiments. The terms in the present disclosure are selected to provide the best explanation on the principles and practical applications of the embodiments and the technical improvements to the arts on market, or to make the embodiments described herein understandable to one skilled in the art.

What is claimed is:

1. A signal generation circuit, comprising: a switch module, a voltage generation module, and a signal generation module, wherein,
   the switch module connected with the voltage generation module comprises at least one control switch, the switch module configured to receive a frequency-divided signal to cause the at least one control switch to open or close based on the frequency-divided signal;
   the voltage generation module is respectively connected with the switch module and the signal generation module, configured to generate a first voltage and a second voltage, wherein the at least one control switch controls the first voltage and the second voltage to change;
   the signal generation module is connected with the voltage generation module and configured to generate, based on the received first voltage and second voltage, a carrier signal having a frequency consistent with a frequency of the frequency-divided signal.

2. The signal generation circuit according to claim 1, wherein the circuit further comprises:
   a frequency division module connected with the switch module and configured to receive a clock signal, perform a frequency division process on the clock signal, and output a frequency-divided signal with a preset frequency to the switch module, wherein the preset frequency is determined based on a frequency of the clock signal and a frequency of an original carrier signal of a power amplifier circuit, and the power amplifier circuit is configured to perform an amplification process of an analog audio signal based on the carrier signal.

3. The signal generation circuit according to claim 1, wherein
   the voltage generation module comprises at least one short-circuit resistor connected in parallel with the control switch;
   the short-circuit resistor is configured to be in a short-circuit state based on the control switch in a closed state, where the first voltage has a first voltage value, and the second voltage has a third voltage value;
   the short-circuit resistor is configured to be in a connected state based on the control switch in an open state, where the first voltage has a second voltage value, and the second voltage has a fourth voltage value;
   wherein the first voltage value is smaller than the second voltage value, and the third voltage value is smaller than the fourth voltage value.

4. The signal generation circuit according to claim 3, wherein the voltage generation module further comprises a voltage-divider resistor,
   the voltage-divider resistor is connected in series with the short-circuit resistor and configured to generate the first voltage at a first terminal and generate the second voltage at a second terminal.

5. The signal generation circuit according to claim 4, wherein
   the switch module comprises a first control switch and a second control switch;
   the short-circuit resistor comprises a first short-circuit resistor and a second short-circuit resistor;
   the first short-circuit resistor is connected in parallel with the first control switch, connected in series with the voltage-divider resistor, and located between the voltage-divider resistor and a power source;
   the second short-circuit resistor is connected in parallel with the second control switch, connected in series with the voltage-divider resistor, and located between the voltage-divider resistor and a ground.

6. The signal generation circuit according to claim 1, wherein the signal generation module comprises a capacitor, a first branch circuit, a second branch circuit, and a comparison unit;
   the comparison unit respectively connected with the voltage generation module and the capacitor is configured to receive the first voltage and the second voltage, output a first feedback signal with a first level to the first branch circuit based on a voltage of the capacitor smaller than the second voltage, and output to the second branch circuit the first feedback signal with the first level based on a voltage of the capacitor larger than a voltage of the first feedback signal;

the first branch circuit is connected with the capacitor and configured to charge the capacitor based on the first feedback signal with the first level;

the second branch circuit is connected with the capacitor and configured to cause the capacitor to discharge based on the second feedback signal with the first level;

the capacitor is respectively connected with the first branch circuit and the second branch circuit, and configured to generate the carrier signal at a connecting terminal connected with the first branch circuit and the second branch circuit.

7. The signal generation circuit according to claim 6, wherein the comparison unit comprises a first comparator, a second comparator, and a trigger;

the first comparator comprises a first input terminal configured to receive the first voltage, a second input terminal configured to receive a carrier signal generated by the capacitor, and a first output terminal configured to output to the trigger a first comparison signal to cause the trigger to output, based on a voltage of the carrier signal larger than the first voltage, to the first branch circuit the first feedback signal with a second level;

the trigger comprises a first trigger terminal and a first feedback terminal, configured to receive the first comparison signal at the first trigger terminal and output to the first branch circuit the first feedback signal at the first feedback terminal;

the first branch circuit comprises a first current source and a first branch circuit switch;

the first current source is connected in series with the first branch circuit switch, with a current direction being a direction flowing toward the capacitor; the first branch circuit switch connected with the capacitor, configured to disconnect with the capacitor based on the first feedback signal at the second level, to cause the capacitor to discharge through the second branch circuit.

8. The signal generation circuit according to claim 7, wherein the comparison unit further includes:

the second comparator including a third input terminal configured to receive a carrier signal output by the capacitor, a fourth input terminal configured to receive the second voltage, and a second output terminal configured to output a second comparison signal to the trigger to cause the trigger to output, based on a voltage of the carrier signal smaller than the second voltage, to the second branch circuit the second feedback signal with the second level;

the trigger further includes a second trigger terminal and a second feedback terminal, and is configured to receive the second comparison signal at the second trigger terminal and output to the second branch circuit the second feedback signal at the second feedback terminal;

the second branch circuit includes a second current source and a second branch circuit switch, wherein, the second current source is connected in series with the second branch circuit switch, and has a current direction being a direction flowing toward the ground;

the second branch circuit switch is connected in series with the capacitor, and configured to disconnect with the capacitor based on the second feedback signal with the second level, to cause the capacitor to charge through the first branch circuit.

9. An audio processing device, comprising: a digital-to-analog converter, a power amplifier circuit, and a signal generation circuit;

the signal generation circuit comprising: a switch module, a voltage generation module, and a signal generation module, wherein, the switch module connected with the voltage generation module comprises at least one control switch, the switch module configured to receive a frequency-divided signal to cause the at least one control switch to open or close based on the frequency-divided signal;

the voltage generation module is respectively connected with the switch module and the signal generation module, configured to generate a first voltage and a second voltage, wherein the at least one control switch controls the first voltage and the second voltage to change;

the signal generation module is connected with the voltage generation module and configured to generate, based on the received first voltage and second voltage, a carrier signal having a frequency consistent with a frequency of the frequency-divided signal;

the digital-to-analog converter connected with the power amplifier circuit, configured to receive a digital audio signal, convert the digital audio signal received into an analog audio signal, and input the analog audio signal into the power amplifier circuit;

the signal generation circuit is connected with the power amplifier circuit and configured to generate a carrier signal with a preset frequency and to output the generated carrier signal to the power amplifier circuit;

the power amplifier circuit is respectively connected with the digital-to-analog converter and the signal generation module, configured to receive the analog audio signal, amplify the analog audio signal based on the carrier signal, and output the amplified signal, wherein a frequency of the amplified signal is consistent with a frequency of the carrier signal, and a clock frequency of the digital-to-analog converter is an integral multiple of the frequency of the carrier signal.

10. The audio processing device according to claim 9, wherein the device further comprises:

an analog-to-digital converter connected with the digital-to-analog converter, configured to receive an audio signal, convert the audio signal into a digital audio signal, and output the digital audio signal to the digital-to-analog converter;

wherein a clock frequency of the analog-to-digital converter is an integral multiple of the frequency of the carrier signal.

* * * * *